(12) United States Patent
Srivastava et al.

(10) Patent No.: US 9,064,692 B2
(45) Date of Patent: Jun. 23, 2015

(54) DRAM CELLS AND METHODS OF FORMING SILICON DIOXIDE

(75) Inventors: Shivani Srivastava, Boise, ID (US); Kunal Shrotri, Boise, ID (US); Fawad Ahmed, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 383 days.

(21) Appl. No.: 13/451,316

(22) Filed: Apr. 19, 2012

(65) Prior Publication Data
US 2013/0277723 A1    Oct. 24, 2013

(51) Int. Cl.
| H01L 21/469 | (2006.01) |
| H01L 21/02 | (2006.01) |
| H01L 27/108 | (2006.01) |
| H01L 21/28 | (2006.01) |

(52) U.S. Cl.
CPC .... *H01L 21/02164* (2013.01); *H01L 21/02318* (2013.01); *H01L 27/10876* (2013.01); *H01L 27/10891* (2013.01); *H01L 21/28185* (2013.01); *H01L 21/28211* (2013.01)

(58) Field of Classification Search
None
See application file for complete search history.

(56) References Cited

U.S. PATENT DOCUMENTS

| 5,646,074 | A | 7/1997 | Chen et al. |
| 6,204,205 | B1 * | 3/2001 | Yu et al. .................. 438/787 |
| 6,743,495 | B2 | 6/2004 | Vasat et al. |
| 7,176,094 | B2 | 2/2007 | Zhong et al. |
| 7,422,960 | B2 | 9/2008 | Fischer |
| 7,479,466 | B2 | 1/2009 | Lu et al. |
| 2004/0192009 | A1 * | 9/2004 | Belyansky et al. ........... 438/424 |

FOREIGN PATENT DOCUMENTS

CN           102110644 A    12/2009

* cited by examiner

*Primary Examiner* — Yasser A Abdelaziez
(74) *Attorney, Agent, or Firm* — Wells St. John P.S.

(57) ABSTRACT

Some embodiments include methods of forming silicon dioxide in which silicon dioxide is formed across silicon utilizing a first treatment temperature of no greater than about 1000° C., and in which an interface between the silicon dioxide and the silicon is annealed utilizing a second treatment temperature which is at least about 1050° C. Some embodiments include methods of forming transistors in which a trench is formed to extend into monocrystalline silicon. Silicon dioxide is formed along multiple crystallographic planes along an interior of the trench utilizing a first treatment temperature of no greater than about 1000° C., and an interface between the silicon dioxide and the monocrystalline silicon is annealed utilizing a second treatment temperature which is at least about 1050° C. A transistor gate is formed within the trench, and a pair of source/drain regions is formed within the monocrystalline silicon adjacent the transistor gate. Some embodiments include DRAM cells.

10 Claims, 2 Drawing Sheets

US 9,064,692 B2

DRAM CELLS AND METHODS OF FORMING SILICON DIOXIDE

TECHNICAL FIELD

DRAM cells and methods of forming silicon dioxide.

BACKGROUND

Silicon dioxide may be incorporated into integrated circuitry as a dielectric material. For instance, silicon dioxide may be utilized as capacitor dielectric, electrical isolation between adjacent electrically conductive circuit components, gate dielectric, etc.

Numerous methods are known for forming silicon dioxide. For instance, silicon dioxide may be deposited across a surface utilizing one or both of atomic layer deposition (ALD) and chemical vapor deposition (CVD). As another example, silicon dioxide may be thermally grown from a silicon-containing surface utilizing radical oxidation and/or furnace oxidation. An example of radical oxidation is in situ steam generation (ISSG). The ISSG may include exposure of the silicon-containing surface to a combination of steam and hydrogen, while maintaining the silicon-containing surface at a temperature of less than or equal to about 1000° C. The ISSG may be conducted within a reaction chamber, with a pressure within such chamber being at or above atmospheric pressure.

There is a continuing goal to improve performance of integrated circuit components, and a continuing goal to decrease dimensions of individual components to achieve increasing levels of integration. Accordingly, it is desired to achieve improved performance from the various materials utilized in integrated circuitry, including silicon dioxide. It is therefore desired to develop improved methods of forming silicon dioxide such that the silicon dioxide may enable fabrication of integrated circuit components having improved performance characteristics.

DETAILED DESCRIPTION OF THE ILLUSTRATED EMBODIMENTS

Some embodiments include utilization of a high-temperature anneal after formation of silicon dioxide to improve characteristics of an interface between the silicon dioxide and a supporting silicon-containing material. Such may improve performance characteristics of components utilizing the silicon dioxide, and in some embodiments may improve performance characteristics of a transistor utilizing the silicon dioxide as gate dielectric. In some embodiments, the transistors may be recessed transistors. Example embodiments are described with reference to FIGS. 1-7.

Figure 1:
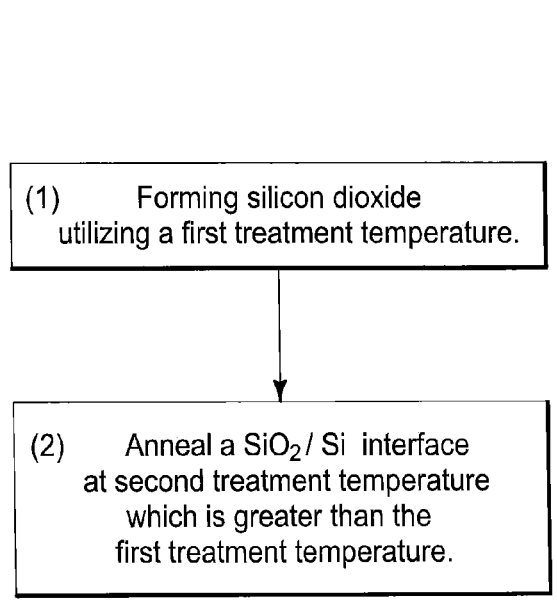
FIG. 1 is a flowchart diagram of an example embodiment.

Referring to FIG. 1, a flowchart diagram 5 describes an example method. In a first step, silicon dioxide is formed along a silicon-containing surface utilizing a first treatment temperature. In some embodiments, the silicon dioxide may be formed by deposition (for instance ALD or CVD), and in such embodiments the first treatment temperature corresponds to the temperature of the substrate that the silicon dioxide is deposited on. In some embodiments, the silicon dioxide may be formed by thermal growth (for instance, growth through furnace oxidation and/or radical oxidation), and the first treatment temperature may correspond to the temperature of the substrate during such thermal growth. In an example embodiment, the thermal growth may comprise ISSG, and the first treatment temperature may be less than or equal to about 1000° C.

In the second step of the FIG. 1 flowchart, an interface between silicon dioxide and silicon is annealed at a second treatment temperature which is greater than the first treatment temperature. In some embodiments, the anneal may be conducted at a temperature of at least about 1050° C.

The anneal of the $SiO_2$/Si interface is found to improve properties of the interface relative to conventional treatments lacking such anneal. For instance, if the silicon dioxide is subsequently incorporated into a transistor as gate dielectric, and if a channel region of the transistor is formed in silicon proximate the $SiO_2$/Si interface, the transistor may have a retention time which is at least doubled relative to an analogous transistor formed without the high-temperature anneal.

An example embodiment method of forming a transistor is described with reference to FIGS. 2-7.

Figure 2:
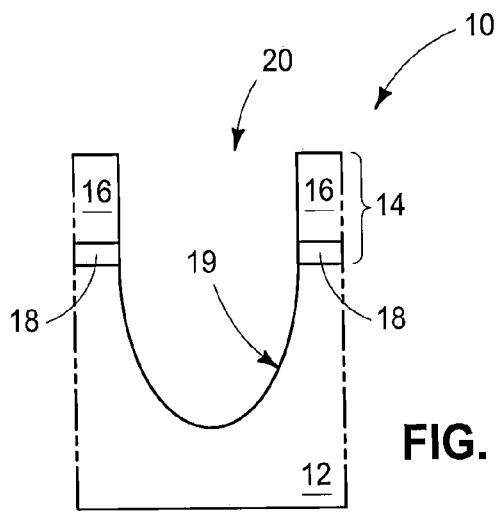
FIGS. 2-7 are diagrammatic cross-sectional views of a portion of a semiconductor construction at various process stages of an example embodiment method.

Referring to FIG. 2, a semiconductor construction 10 is shown to comprise a patterned mask 14 over a silicon-containing base 12.

Base 12 may comprise, consist essentially of or consist of monocrystalline silicon, and may be referred to as a semiconductor substrate, or as a portion of a semiconductor substrate. The terms "semiconductive substrate," "semiconductor construction" and "semiconductor substrate" mean any construction comprising semiconductor material, including, but not limited to, bulk semiconductor materials such as a semiconductor wafer (either alone or in assemblies comprising other materials), and semiconductor material layers (either alone or in assemblies comprising other materials). The term "substrate" refers to any supporting structure, including, but not limited to, the semiconductor substrates described above. Base 12 may correspond to a semiconductor substrate containing one or more materials associated with integrated circuit fabrication in some embodiments. Some of the materials may be under the shown region of the base and/or may be laterally adjacent the shown region of the base; and may correspond to one or more of refractory metal materials, barrier materials, diffusion materials, insulator materials, etc.

The illustrated patterned mask 14 comprises silicon nitride 16 over a pad of silicon dioxide 18. Other patterned masks may be utilized in other embodiments. The patterned mask may be formed utilizing conventional methods.

The patterned mask 14 defines an opening 20, and such opening has been extended into base 12. The opening may be extended into base 12 utilizing one or more suitable etches. In some embodiments, opening 20 may be a trench which extends in and out of the page relative to the cross-sectional view of FIG. 2. The opening 20 in the embodiment of FIG. 2 may be utilized to form a recessed transistor, such as the transistor described below with reference to FIG. 7. In other embodiments, processing described herein (for instance, the processing described above with reference to FIG. 1) may be utilized to form FINFET devices (and in some embodiments may be utilized to treat silicon dioxide along saddles of the FINFET devices), or may be utilized to form any other suitable devices that are either now known or yet to be developed.

A periphery of opening 20 comprises a silicon-containing surface 19 of base 12. In some embodiments, base 12 comprises monocrystalline silicon and the surface 19 comprises multiple exposed crystallographic planes of the monocrystalline silicon.

Figure 3:
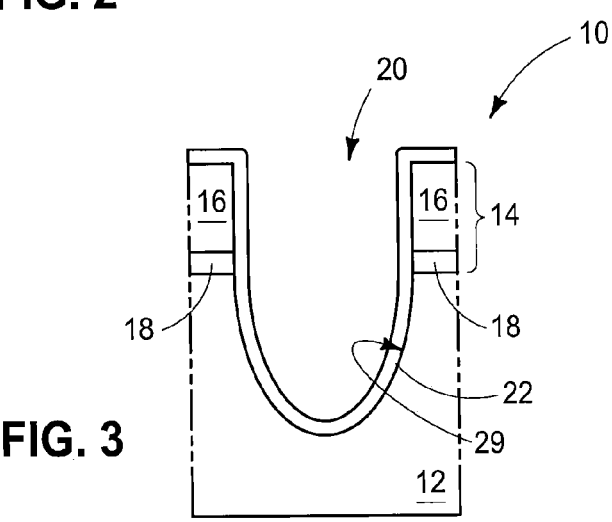

Referring to FIG. 3, a liner 22 is formed within opening 20. The liner may be formed by ALD, CVD, furnace oxidation, radical oxidation and/or any other suitable method while maintaining a temperature of base 12 at less than or equal to about 1000° C. In some embodiments, the liner may be formed utilizing ALD, CVD, furnace oxidation, radical oxidation and/or any other suitable method while maintaining base 12 at a temperature within a range of from about 700° C. to about 1000° C. The temperature of base 12 during the growth of the liner 22 corresponds to the first treatment temperature referred to in the flowchart of FIG. 1.

A portion of liner 22 directly against base 12 may comprise, consist essentially of, or consist of silicon dioxide.

As discussed above, the liner 22 may be formed by any suitable method having an appropriate treatment temperature. In some embodiments, the silicon dioxide may be formed by oxidation of the silicon-containing surface 19; and in such embodiments the silicon dioxide may be considered to be thermally grown from base 12. The thermal growth may cease after a limiting amount of silicon dioxide is formed due to the inability of additional reactants to penetrate through the silicon dioxide and further react with materials underlying the silicon dioxide. In some embodiments, the limiting amount of silicon dioxide formed under thermal growth conditions may be from about 45 Å to about 75 Å.

An $SiO_2$/Si interface 29 occurs where silicon dioxide of liner 22 joins with silicon of base 12.

The region of liner 22 adjacent hard mask 14 may comprise materials other than silicon dioxide. For instance, if masking material 16 comprises silicon nitride, then silicon oxynitride may be formed as the region of liner 22 adjacent such masking material. In the shown embodiment, the liner has an approximately constant thickness extending along base 12, and along the masking materials 16 and 18. In other embodiments, the liner may be formed to different thicknesses along one or both of the masking materials than along the base 12, and in some embodiments there may be little or no liner formed along one or both of the masking materials.

Figure 4:
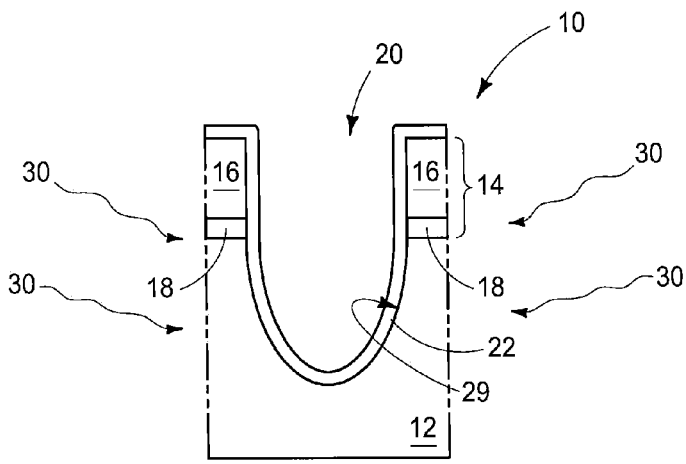

Referring to FIG. 4, construction 10 is illustrated exposed to thermal energy 30 during an anneal of the interface 29. Such anneal may comprise raising a temperature of base 12 to at least about 1050° C. The temperature of base 12 during the anneal of interface 29 may correspond to the second treatment temperature referred to in the flowchart of FIG. 1. In some embodiments, the anneal temperature may be within a range of from about 1050° C. to about 1200° C. The second treatment temperature is described herein as referring to the temperature of base 12 in some embodiments, because in practice the base may be heated in order to achieve a desired temperature of interface 29.

The second treatment temperature may be maintained within the base 12, and therefore the interface 29, for any suitable time. In some embodiments, the second treatment temperature may be maintained for a duration of from about 1 second to about 60 minutes. In some embodiments, the second treatment temperature may be maintained for a duration of from about 5 seconds to about 60 minutes. In some embodiments, the second treatment temperature may be considered to subject the silicon dioxide/silicon interface to a high thermal budget after an initial oxidation induced by the first thermal treatment.

The second treatment temperature may be maintained while construction 10 is within a reaction chamber (e.g., a furnace) and under any suitable ambient. In some embodiments, the ambient may consist of material inert relative to reaction with the silicon dioxide under the reaction conditions of the second temperature treatment; and may, for example, comprise, consist essentially of, or consist of $N_2$. Any suitable pressure may be within the chamber during the second temperature treatment; such as, for example, a pressure which is about atmospheric.

In embodiments in which liner 22 is formed by thermal growth, a temperature of base 12 and the associated interface 29 may be ramped to the second treatment temperature immediately after thermal growth of silicon dioxide has ceased, and without cooling of the interface. In other embodiments, interface 29 may be cooled after formation of the silicon dioxide, and prior to exposure of the interface to the second treatment temperature. For instance, in some embodiments base 12 and the associated interface 29 may be cooled to a temperature of less than or equal to about 700° C. prior to ramping base 12 to the second treatment temperature.

The thermal anneal of interface 29 may occur in the same chamber utilized for the formation of liner 22 in some embodiments, or in a different chamber in other embodiments.

Figure 5:
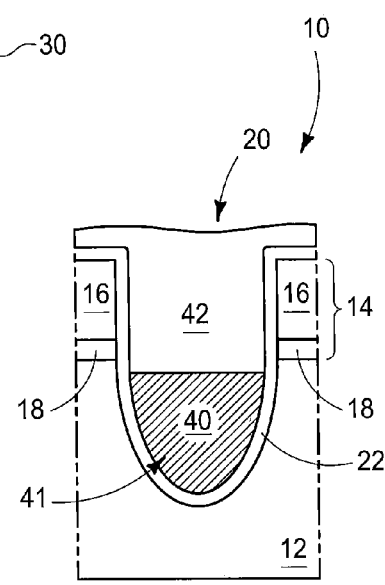

Referring to FIG. 5, electrically conductive gate material 40 is formed in a bottom of opening 20, and electrically insulative material 42 is formed over the gate material. The electrically conductive gate material may comprise any suitable composition or combination of compositions; including, for example, one or more of various metals (for instance, tungsten, titanium, etc.), metal-containing materials (for instance, metal silicides, metal nitrides, metal carbide, etc.) and conductively-doped semiconductor materials (for instance, conductively-doped silicon, conductively-doped germanium, etc.). The electrically insulative material 42 may comprise any suitable composition or combination of compositions; including, for example, one or more of silicon nitride, silicon dioxide, borophosphosilicate glass, phosphosilicate glass, fluorosilicate glass, etc. The materials 40 and 42 may be formed utilizing conventional methods.

The gate material 40 may be a wordline extending in and out of the page relative to the cross-section of FIG. 5. The portion of the gate material 40 within the cross-section of FIG. 5 may be considered to be a transistor gate 41.

Figure 6:
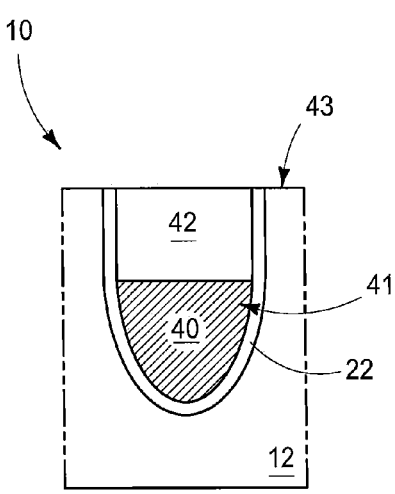

Referring to FIG. 6, construction 10 is subjected to planarization (for instance, chemical-mechanical polishing) to remove mask 14 (FIG. 5) and form a planarized surface 43 extending across base 12 and insulative material 42.

Figure 7:
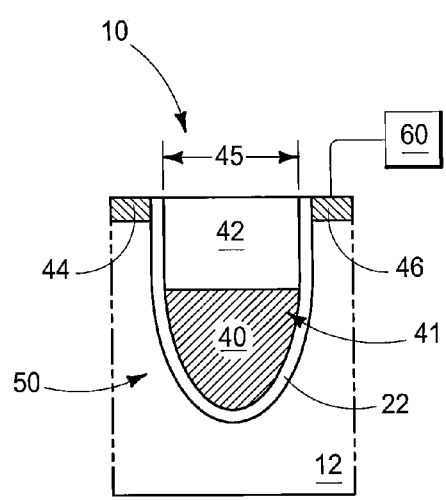

Referring to FIG. 7, source/drain regions 44 and 46 are formed within base 12 on opposing sides of the transistor gate 41 from one another. The source/regions 44 and 46 may be formed by implanting suitable dopant into base 12 utilizing conventional methods. The source/drain regions 44 and 46, together with gate 41, form a transistor 50. The silicon dioxide of liner 22 is a gate oxide of such transistor, and spaces the gate from a channel region.

The processing described herein, and specifically the annealing of interface 29 (FIG. 4) at a higher temperature than that utilized to grow the silicon dioxide of liner 22, forms a transistor which may have improved properties relative to conventional transistors. Specifically, the transistor 50 may have a retention time that is at least doubled relative to that of an analogous transistor formed without the annealing described above with reference to FIG. 4, and in some cases which is tripled, quadrupled, etc., relative to the retention time of such analogous transistor.

In some embodiments, the gate 41 has a width 45 of less than or equal to about 40 nanometers.

In some embodiments, one of the source/drain regions may be electrically coupled to a charge-storage device 60 (such as a capacitor) to form a DRAM cell. In some embodiments, such DRAM cell may be a representative DRAM cell within an array of substantially identical DRAM cells. Such array may have a time to 200 bit per die failure of 400 milliseconds or higher for charge retention, even utilizing devices in which gate width 45 is less than or equal to about 40 nanometers. The retention time may be substantially longer than the retention time obtained utilizing conventionally-formed DRAM cells, which can reduce refresh and thereby provide numerous advantages relative to the array of conventionally-formed DRAM cells; including, for example, less power drain, fewer clock cycles devoted to refresh, etc. In some embodiments, methods described herein may be utilized to fabricate DRAM arrays having substantially improved variable retention times across the cells of the arrays relative to conventionally-formed DRAM arrays.

The example embodiment of FIGS. 2-7 may form silicon dioxide within an opening that extends into a monocrystalline silicon base. In such embodiments, the silicon dioxide may be formed across multiple planes of the monocrystalline silicon. The processing described herein of annealing silicon dioxide at a higher temperature than that utilized to grow the silicon dioxide may be particularly effective for improving devices in which the silicon dioxide is grown across multiple crystallographic planes of monocrystalline silicon. However, the processing may also provide improvements in applications in which silicon dioxide is grown along only a single plane of monocrystalline silicon (for instance, across an upper surface of a monocrystalline silicon wafer), or along other forms of silicon besides monocrystalline silicon (for instance, polycrystalline silicon or amorphous silicon). Accordingly, the invention includes embodiments in which silicon dioxide is formed along only one crystallographic plane of monocrystalline silicon, as well as embodiments in which silicon dioxide is formed against other forms of silicon besides monocrystalline silicon.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In some embodiments, the invention includes a method of forming silicon dioxide in which silicon dioxide is formed across a silicon-containing surface utilizing a first treatment temperature of less than or equal to about 1000° C., and in which an interface between the silicon dioxide and the silicon-containing surface is annealed utilizing a second treatment temperature which is at least about 1050° C.

In some embodiments, the invention includes a method of forming silicon dioxide in which an opening is formed to extend into monocrystalline silicon. The opening exposes multiple crystallographic planes of the monocrystalline silicon. Silicon dioxide is formed along the multiple crystallographic planes along an interior surface of the opening utilizing a first treatment temperature of less than or equal to about 1000° C. An interface between the silicon dioxide and the monocrystalline silicon is annealed utilizing a second treatment temperature which is at least about 1050° C.

In some embodiments, the invention includes a method of forming a transistor. A trench is formed to extend into monocrystalline silicon. The trench exposes multiple crystallographic planes of the monocrystalline silicon. Silicon dioxide is formed along the multiple crystallographic planes along an interior surface of the trench utilizing a first treatment temperature of less than or equal to about 1000° C. An interface between the silicon dioxide and the monocrystalline silicon is annealed utilizing a second treatment temperature which is at least about 1050° C. A transistor gate is formed within the trench. The transistor gate is spaced from the monocrystalline silicon by the silicon dioxide. A pair of source/drain regions is formed within the monocrystalline silicon; with the source/drain regions being on opposing sides of the transistor gate from one another.

In some embodiments, the invention includes a DRAM cell. The cell includes a gate spaced from a silicon-containing channel region by silicon dioxide, source/drain regions on opposing sides of the gate relative to one another, and a charge-storage device coupled to one of the source/drain regions. The silicon dioxide is formed utilizing the two stages of (1) growing silicon dioxide across a silicon-containing surface utilizing a first treatment temperature of less than or equal to about 1000° C., and (2) annealing an interface between the silicon dioxide and the silicon-containing surface utilizing a second treatment temperature which is at least about 1050° C. The gate has a width of less than or equal to about 40 nanometers. The DRAM cell is within an array having a time to 200 bit per die failure of at least about 400 milliseconds for charge retention.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming silicon dioxide, comprising:
   forming silicon dioxide across a silicon-containing surface utilizing a first treatment temperature of less than or equal to about 1000° C., wherein the forming of the silicon dioxide comprises thermal growth of the silicon dioxide to a thickness of from 45 Å to 75 Å;
   annealing an interface between the thermally-grown silicon dioxide and the silicon-containing surface utilizing a second treatment temperature which is at least about 1050° C.; the annealing utilizing a single thermal treatment conducted in a reaction chamber having an ambient atmosphere consisting essentially of $N_2$, the thermally-grown silicon dioxide being uncovered and fully exposed to the ambient atmosphere during the annealing; and
   cooling the interface to a temperature below the first treatment temperature prior to the annealing of the interface.

2. The method of claim 1 wherein the cooling of the interface comprises cooling the interface to a temperature of less than about 700° C. prior to the annealing of the interface.

3. A DRAM cell comprising a transistor having a gate oxide formed by the method of claim 1.

4. The DRAM cell of claim 3 within an array having a time to 200 bit per die failure of at least about 400 milliseconds for charge retention.

5. A method of forming silicon dioxide, comprising:
    forming an opening extending into monocrystalline silicon, the opening exposing multiple crystallographic planes of the monocrystalline silicon;
    forming silicon dioxide having a thickness of from 45 Å to 75 Å along the multiple crystallographic planes along an interior surface of the opening utilizing a first treatment temperature of less than or equal to about 1000° C.; and
    annealing an interface between the silicon dioxide and the monocrystalline silicon utilizing a second treatment temperature which is at least about 1050° C.; the annealing utilizing a single thermal process conducted in a reaction chamber having an ambient atmosphere consisting essentially of $N_2$, the silicon dioxide being uncovered and fully exposed to the ambient atmosphere during the annealing.

6. The method of claim 5 wherein the forming of the silicon dioxide comprises self-limiting thermal growth, and further comprising heating the interface to the second treatment temperature after the thermal growth of the silicon dioxide ceases and without cooling the interface to a temperature below the first treatment temperature.

7. The method of claim 5 further comprising cooling the interface to a temperature below the first treatment temperature prior to the annealing of the interface.

8. The method of claim 5 wherein the first treatment temperature is within a range of from about 700° C. to about 1000° C.; and wherein the second treatment temperature is within a range of from about 1050° C. to about 1200° C.

9. A DRAM cell comprising a transistor having a gate oxide formed by the method of claim 5.

10. The DRAM cell of claim 9 within an array having a time to 200 bit per die failure of at least about 400 milliseconds for charge retention.

* * * * *